(12) United States Patent
Shih et al.

(10) Patent No.: US 7,704,865 B2
(45) Date of Patent: Apr. 27, 2010

(54) METHODS OF FORMING CHARGE-TRAPPING DIELECTRIC LAYERS FOR SEMICONDUCTOR MEMORY DEVICES

(75) Inventors: Yen-Hao Shih, Changhua (TW);
Shih-Chin Lee, Siluo Township (TW);
Jung-Yu Hsieh, Hsinchu (TW);
Erh-Kun Lai, Longjing Shiang (TW);
Kuang Yeu Hsieh, Jhubei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 371 days.

(21) Appl. No.: 11/209,875

(22) Filed: Aug. 23, 2005

(65) Prior Publication Data
US 2007/0054449 A1    Mar. 8, 2007

(51) Int. Cl.
*H01L 21/425* (2006.01)
(52) U.S. Cl. ............ 438/530; 257/E21.18; 257/E21.21; 257/E21.423; 257/E21.679; 257/E29.309; 257/324; 257/389
(58) Field of Classification Search ............ 257/E21.18, 257/E21.21, E21.423, E21.679, 324, E29.309, 257/389; 438/530
See application file for complete search history.

(56) References Cited

U.S. PATENT DOCUMENTS

| | | | |
|---|---|---|---|
| 3,463,974 A * | 8/1969 | Kelley et al. ................. | 257/395 |
| 6,043,124 A | 3/2000 | Wu | |
| 6,074,917 A * | 6/2000 | Chang et al. ................. | 438/261 |
| 6,395,654 B1 * | 5/2002 | Yang et al. ................... | 438/306 |
| 6,436,768 B1 | 8/2002 | Yang et al. | |
| 6,461,908 B2 * | 10/2002 | Stolk et al. ................... | 438/228 |
| 6,503,846 B1 * | 1/2003 | Niimi et al. .................. | 438/776 |
| 6,562,683 B1 | 5/2003 | Wang et al. | |
| 6,660,095 B2 * | 12/2003 | Shim ....................... | 118/723 E |
| 6,709,927 B1 | 3/2004 | Ogle, Jr. et al. | |
| 6,709,959 B2 * | 3/2004 | Kase et al. ................... | 438/530 |
| 6,803,279 B2 | 10/2004 | Eitan | |
| 2002/0179970 A1 * | 12/2002 | Yagishita et al. ............. | 257/350 |

* cited by examiner

*Primary Examiner*—Matthew C Landau
*Assistant Examiner*—Daniel Luke
(74) *Attorney, Agent, or Firm*—Jianq Chyun IP Office

(57) ABSTRACT

Methods of forming charge-trapping dielectric layer structures in semiconductor memory devices which comprise: (a) providing a semiconductor substrate; (b) forming an oxide layer on at least a portion of the substrate; (c) forming two or more source/drain regions in the substrate below the oxide layer; (d) re-oxidizing the oxide layer; (e) forming a charge-trapping dielectric layer on the oxide layer; and (f) forming an insulating layer on the charge-trapping dielectric layer; as well as methods which comprise: (a) providing a semiconductor substrate; (b) forming an oxide layer on at least a portion of the substrate in a dry atmosphere; (c) forming two or more source/drain regions in the substrate below the oxide layer; (d) forming a charge-trapping dielectric layer on the oxide layer; (e) forming an insulating layer on the charge-trapping dielectric layer; and (f) annealing the insulating layer in an atmosphere having a hydrogen content of less than about 0.01% are described.

20 Claims, 5 Drawing Sheets

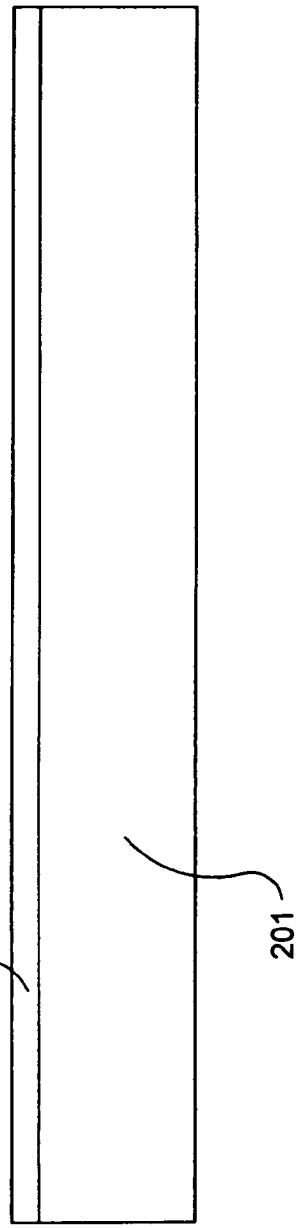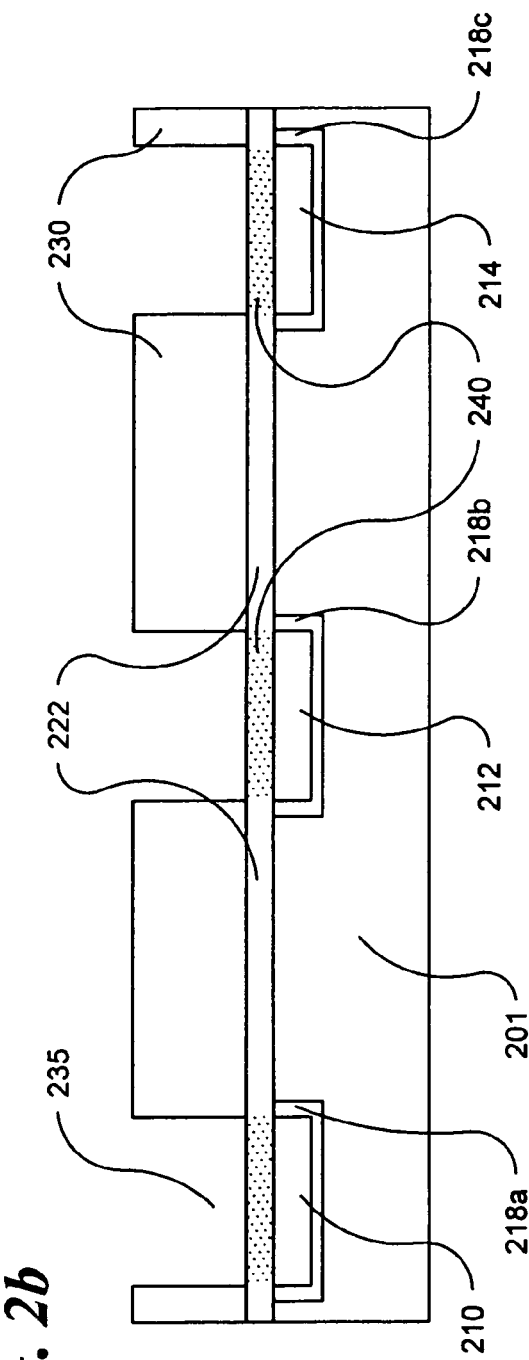

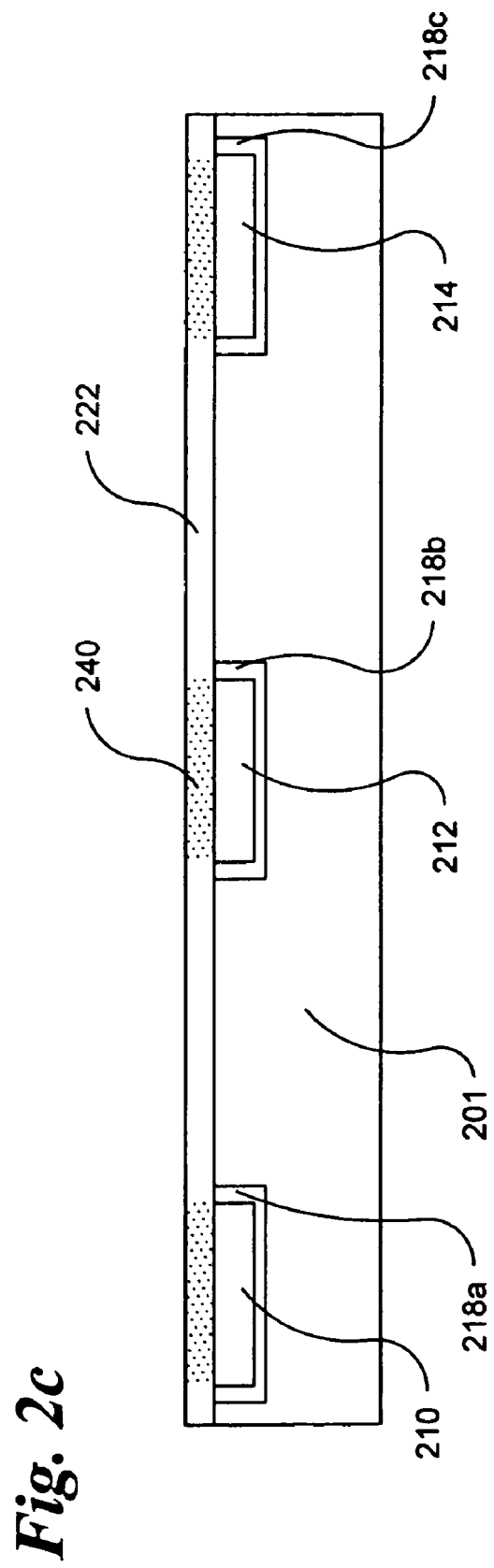

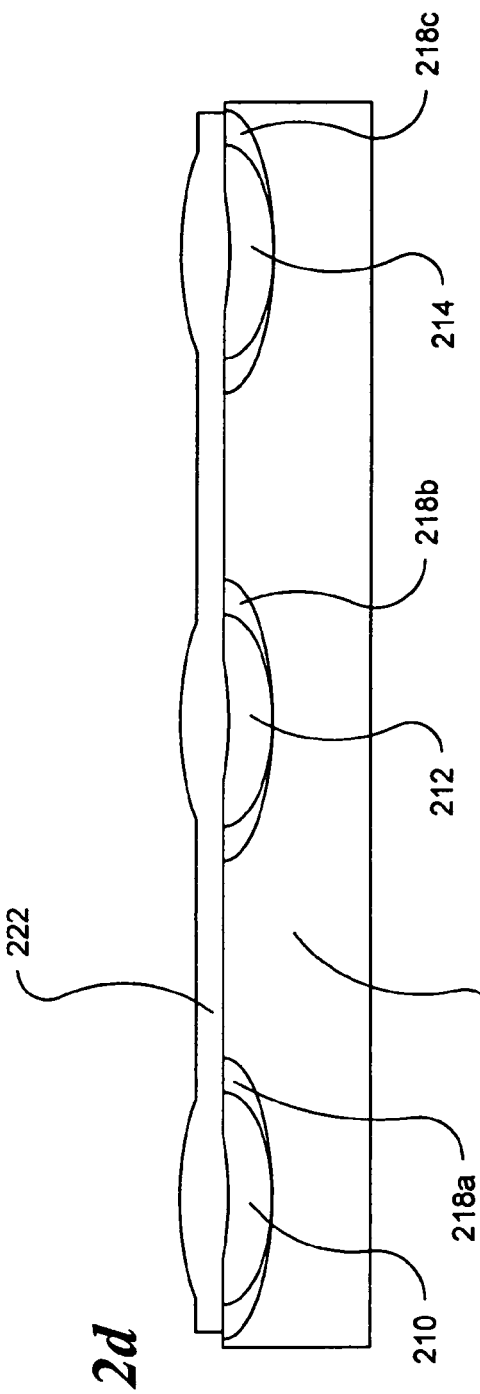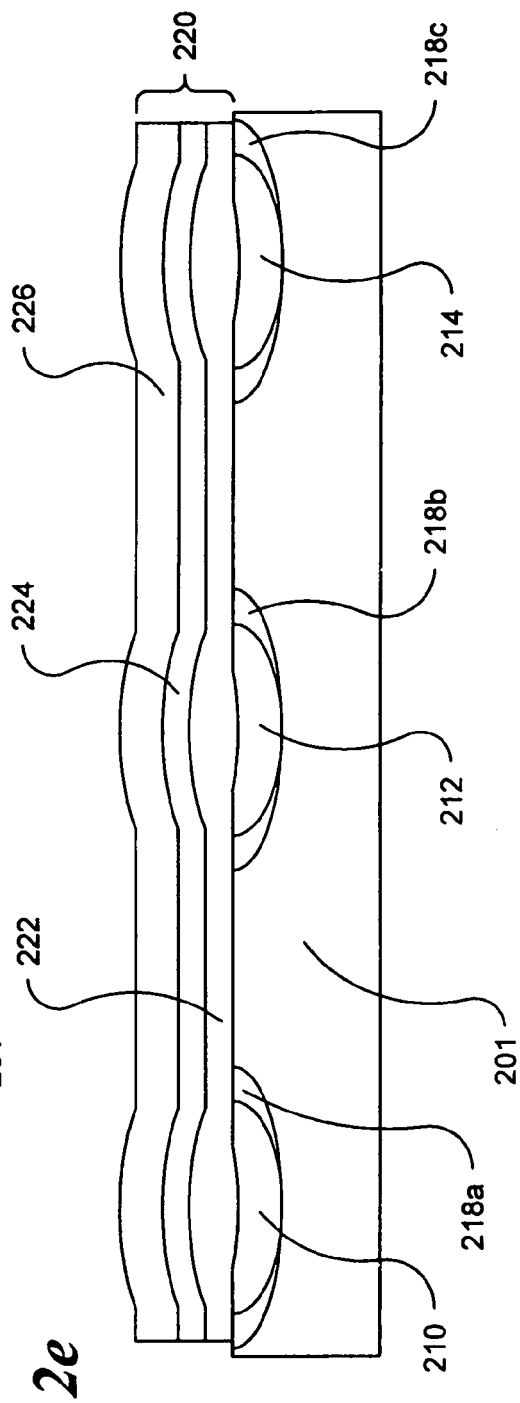

METHODS OF FORMING CHARGE-TRAPPING DIELECTRIC LAYERS FOR SEMICONDUCTOR MEMORY DEVICES

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

Non-volatile memory cells generally include a charge-trapping layer structure situated between a control gate and a substrate having a source and a drain region. Often the charge-trapping structure is constructed of multiple layers, for example, a first insulating layer disposed on the substrate, a charge-trapping layer disposed on the first insulating layer, and a second insulating layer disposed on the charge-trapping layer beneath the gate electrode. Charge-trapping layers may be of a type which hold charge in a localized manner, or they may comprise floating gates which are comprised of a conductive material such that the stored charge is spread throughout the floating gate layer. Charge-trapping layers which store charge in a localized manner, such as silicon nitride, are capable of storing more than one area of charge per memory cell. Such localized charge storage allows one charge (bit-1) to be stored in the charge-trapping layer in an area adjacent to one source/drain region and another charge (bit-2) to be stored in the charge-trapping layer in an area adjacent to the other source/drain region. Two-bit memory cells have received a great deal of attention in recent years as demands for reduced memory cell size and increased memory capacity have grown.

Unfortunately, non-volatile memory cells which employ charge-trapping layers and store charge in a localized manner are not without problems. For example, in nitride storage memory cells where the charge-trapping layer generally comprises a silicon nitride layer sandwiched between two silicon dioxide layers ("ONO structure"), hydrogen atoms may become trapped at the interfacial sites between the silicon substrate and the bottom oxide (first insulating) layer of the charge-storage ONO structure. It is believed that interfacially trapped hydrogen is at least partly responsible for some loss of threshold voltage in memory devices having an interface between silicon and another material.

In addition, source/drain regions in memory devices are often formed as a series of parallel lines of buried-diffusion doped implants (i.e., bit lines) beneath the surface of the substrate. The formation of bit lines in a substrate, for example, by ion implantation, can damage other layers of material (e.g., a silicon dioxide dielectric layer) which have already been deposited on the substrate and may also damage the substrate/oxide layer interface. Such damage to these additional layers is believed to also cause data storage and other performance problems in memory devices.

Accordingly, there is a need for improved methods of forming non-volatile memory cells and devices which employ localized charge-trapping layers.

BRIEF SUMMARY OF THE INVENTION

The invention relates, in general, to semiconductor memory devices, and more particularly, to methods of forming charge-trapping dielectric layer structures in semiconductor memory devices, and preferably those devices which can employ band-to-band hot hole methods for erase and/or reset operations. The present invention also relates to methods of forming charge-trapping dielectric layers and buried diffusion bit lines for memory devices, and preferably ONO layers and buried diffusion bit lines for nitride flash memory. Semiconductor memory devices prepared according to the methods of the present invention exhibit significantly decreased charge loss, and thus, excellent data retention properties.

One embodiment of the present invention includes methods which comprise: (a) providing a semiconductor substrate; (b) forming an oxide layer on at least a portion of the substrate; (c) forming two or more source/drain regions in the substrate below the oxide layer; (d) re-oxidizing the oxide layer; (e) forming a charge-trapping dielectric layer on the oxide layer; and (f) forming an insulating layer on the charge-trapping dielectric layer.

In certain preferred embodiments of the present invention, the methods further include cleaning and/or annealing the oxide layer prior to re-oxidation. In some preferred methods according to the present invention, the formation of the oxide layer and/or the re-oxidation of the oxide layer are carried out in a dry atmosphere. In certain preferred methods according to the present invention, the formation of the charge-trapping dielectric layer and/or the formation of the insulating layer can be carried out using low pressure chemical vapor deposition. In certain preferred embodiments of the present invention, the methods further include annealing the insulating layer.

A particularly preferred embodiment of the present invention includes methods for forming an ONO layer on a silicon semiconductor substrate, which comprise: (a) providing a silicon semiconductor substrate; (b) forming a bottom silicon dioxide layer on at least the portion of the substrate in a dry atmosphere; (c) forming two or more source/drain regions in the substrate below the bottom silicon dioxide layer; (d) cleaning and annealing the bottom silicon dioxide layer; (e) re-oxidizing the bottom silicon dioxide layer in a dry atmosphere; (f) depositing a silicon nitride layer on the bottom silicon dioxide layer via low pressure chemical vapor deposition; (g) depositing a top silicon dioxide layer on the silicon nitride layer via low pressure chemical vapor deposition; and (h) subjecting the top silicon dioxide layer to a rapid thermal anneal in an atmosphere having a hydrogen content of less than about 0.01%.

Another embodiment of the present invention includes methods which comprise: (a) providing a semiconductor substrate; (b) forming an oxide layer on at least a portion of the substrate in a dry atmosphere; (c) forming two or more source/drain regions in the substrate below the oxide layer; (d) forming a charge-trapping dielectric layer on the oxide layer; (e) forming an insulating layer on the charge-trapping dielectric layer; and (f) annealing the insulating layer in an atmosphere having a hydrogen content of less than about 0.01%.

Methods in accordance with the present invention produce semiconductor memory devices with a significantly reduced hydrogen concentration at the oxide/substrate interface. Additionally, certain methods according to the present invention simultaneously provide a decreased hydrogen concentration at the oxide/substrate interface and help to repair damage that may have been done to the oxide layer during doping of the substrate.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 2a is a schematic representation of an oxide layer formed on a semiconductor substrate in accordance with one aspect of the present invention;

FIG. 2b is a schematic representation of the semiconductor memory region of FIG. 3a after doping by ion implantation;

FIG. 2c is a schematic representation of the ion implantation-damaged oxide layer over the doped substrate of FIG. 3b following removal of the photo-resist masking layer and cleaning of the oxide layer;

FIG. 2d is a schematic representation of the semiconductor memory region of FIG. 3c after re-oxidation of the oxide layer;

FIG. 2e is a schematic representation of the semiconductor memory region of FIG. 3d after deposition of a silicon nitride layer and a top silicon dioxide layer in accordance with one embodiment of the present invention.

DETAILED DESCRIPTION OF THE INVENTION

Figure 1:
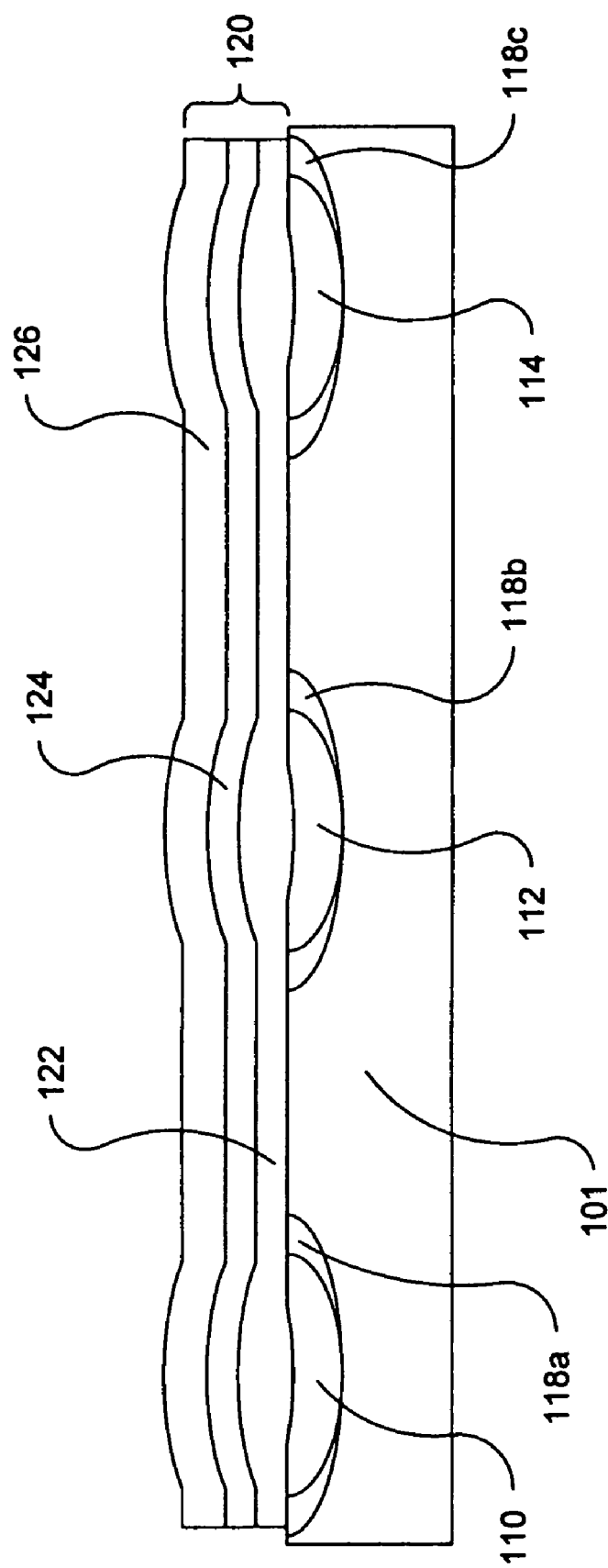
FIG. 1 is a cross-sectional schematic representation of a region of a non-volatile memory device prepared in accordance with one embodiment of the present invention, taken along a plane perpendicular to the substrate surface and perpendicular to the direction of the N+ buried diffusion bit lines.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are conventionally used in the art.

Referring to FIG. 1, memory cells prepared in accordance with methods of the present invention include a semiconductor substrate 101. Below the surface of the substrate 101, a number of source/drain regions 110, 112 & 114 can be formed. In certain preferred embodiments, additional pocket implants 118a, 118b & 118c of oppositely doped material can be formed adjacent to one or more of the source/drain regions 110, 112 & 114. As used above, the term "oppositely doped" refers to doping of the pocket implants in a manner opposite to the doping of the source/drain regions. Thus, where the source/drain regions comprise n-type doped regions, pocket implantation can comprise p-type doping, and vice versa. On the surface of the substrate, above the source/drain regions 110, 112 & 114, a charge-trapping dielectric layer structure 120 is formed comprising an oxide layer 122 disposed above the substrate surface, a charge-trapping layer 124 disposed above the oxide layer 122, and an insulating layer 126 disposed above the charge-trapping layer 124. After formation of the charge-trapping dielectric layer structure 120, gate materials (not shown) may be deposited in any suitable pattern above the charge-trapping dielectric layer structure 120. For example, one or more gates may be formed by depositing word lines in a direction perpendicular to the buried diffusion bit lines. Examples of suitable gate materials include N+ or P+ doped polysilicon, metals and metal suicides.

Methods in accordance with the present invention include providing a semiconductor substrate. The semiconductor substrate refers to the material on which a memory device is fabricated. In many preferred embodiments of the present invention, the semiconductor substrate comprises a silicon material. However, any other semimetal element capable of appropriate doping could be employed as the semiconductor substrate in the methods according to the present invention.

Silicon wafers prepared via standard techniques can be used to prepare a suitable substrate. For example, suitable wafers can be prepared via a process wherein silicon is grown from a small crystal, called the seed crystal, rotated and slowly withdrawn from a molten hyper-pure silicon to give a cylindrical crystal, which is then sliced to obtain thin disks, which after slicing, are finely ground, mirror-smooth polished and cleaned.

In accordance with several preferred embodiments of the present invention, the silicon semiconductor substrate comprises p-type silicon. Generally, p-type silicon substrates capable of use in accordance with such preferred embodiments of the present invention include silicon wafers which have been lightly p-doped. P-type doping of silicon can be carried out in any suitable manner, such as, via an implantation of, for example, boron, or gallium or any other freeelectron deficient substance capable of use in semiconductor materials. Preferably, the p-type doping can be carried out at a dosage level of from about $10^{12}/cm^3$ to about $10^{18}/cm^3$. More preferably, the p-type doping can be carried out at a dosage level of from about $10^{16}/cm^3$ to about $10^{18}/cm^3$.

It should be understood that while many of the preferred embodiments of the invention described herein depict NPN junctions wherein the semiconductor substrate comprises p-type silicon having two or more source/drain regions formed via n-type doping, the methods of the present invention can be employed to prepare PNP junction memory.

Methods in accordance with the present invention further include forming an oxide layer on at least a portion of the substrate. In general, the oxide layer is formed on the surface of the substrate above the area of the substrate having source/drain regions (e.g., buried diffusion bit lines) formed therein, which area constitutes the memory cell array portion of such a device. Preferably, the oxide layer is thermally grown. Exemplary thermal methods for forming the oxide layer include furnace oxidation, rapid thermal oxidation, and plasma-assisted oxidation. However, any method of forming an oxide on the surface of the substrate can be employed in the methods of the present invention, including but not limited to various chemical vapor deposition methods such as low-pressure CVD oxide deposition. In certain preferred embodiments of the present invention, the oxide layer is comprised of silicon dioxide.

In accordance with the present invention, the oxide layer is typically formed with a thickness of 5 angstroms to 100 angstroms, preferably 30 angstroms to 80, and most preferably 40 angstroms to 70.

Referring to FIG. 2a, in a particularly preferred embodiment of the present invention, a lightly p-doped silicon substrate 201 is provided and an oxide layer 222, having a thickness of about 45 angstroms is thermally grown on a portion of the surface of the substrate 201.

The methods of the present invention also include the formation of at least two source/drain regions. Each source/drain region comprises an area within the substrate which is doped in a manner corresponding in complementary fashion to the type of substrate doping employed. In other words, where a p-type substrate is employed, the source/drain regions are n-doped, and vice versa. Thus, in preferred embodiments wherein the substrate comprises p-type silicon, the at least two source/drain regions will comprise n+ doped regions, preferably having a high dose of n-type doping.

As is understood by those of ordinary skill in the art, each memory cell comprises two source/drain regions, each of which may serve as a source or a drain, depending upon the location of the applied voltages. The term "source/drain region", as used herein, refers to the dual nature of such regions in that they can function as either a source or a drain depending upon the applied voltage. When referring to a specific operation in a memory cell in accordance with the present invention wherein one region serves as the source and the other region serves as the drain, the terms "source" and "drain" may be used separately in reference to the particular region. However, the use of either term separately is not to be construed as limiting either region in its function, or as limiting the invention in regard to any specific location of the source and the drain.

In accordance with certain preferred embodiments of the present invention, the two or more source/drain regions are formed in the substrate by ion implantation. Ion implantation in accordance with such preferred embodiments can comprise implantation of ions of one or more elements selected, for example, from arsenic, phosphorous, and nitrogen, wherein the dosage of ion implantation is about $10^{17}/cm^3$ to $10^{21}/cm^3$. In certain preferred embodiments, the source/drain regions may comprise buried diffusion bit lines wherein the substrate is doped in two or more regularly spaced parallel line areas.

Additionally, in certain preferred embodiments, pocket implantation of oppositely doped regions adjacent to the source/drain (bit line) regions may be carried out. For example, where the two or more source/drain regions comprise n+ doped regions, additional pocket implantation of highly p-doped smaller areas adjacent to one or more of the source/drain regions may be carried out.

Any method for carrying out ion implantation known in the art may be employed in accordance with such preferred embodiments of the present invention. For example, referring to FIG. 2b, a photo-resist masking layer 230 can be deposited on the oxide layer 222 and developed via any suitable lithography method to provide a pattern for implantation. Implantation can then be carried out, doping the areas 210, 212 & 214 of the substrate 201 below the exposed pattern 235 in the photo-resist masking layer 230. Optionally, additional pocket implantation regions 218a, 218b & 218c may be formed. Damage to the oxide layer 240 may occur as a result of the implantations. Following formation of the source/drain regions, the photo-resist masking layer 230 can be removed.

Referring to FIG. 2c, in certain preferred embodiments of the present invention, subsequent to the formation of the source/drain regions 210, 212 & 214 and any optional pocket implant 218a, 218b & 218c formation, the photo-resist masking layer material is removed and the oxide layer 222 (including damaged oxide area(s) 240) is subjected to a cleaning and/or annealing process, whereby the oxide layer 222 is left uncovered. Cleaning of the oxide layer surface to remove photoresist materials and other surface debris can be carried out in any manner known or to be developed. Any annealing process suitable for suppressing transient-enhanced diffusion (TED) and/or oxidation-enhanced diffusion (OED) can be employed in the annealing of the oxide layer. In certain embodiments of the present invention, annealing can be carried out using a rapid thermal anneal, preferably at a temperature of about 700° C. to about 1100° C. for a time of about 10 seconds to about 10 minutes. The annealing of the oxide layer is preferably carried out in an inert atmosphere, such as nitrogen or argon. In one embodiment of the present invention the oxide layer is annealed at a temperature of about 950° C. for approximately 30 seconds in an inert gas atmosphere.

In certain embodiments of the present invention, after formation of the source/drain regions, the oxide layer is re-oxidized. Re-oxidation of the oxide layer can be carried out in any manner suitable for oxidation such as, for example, those disclosed herein for the formation of the oxide layer. In one embodiment, re-oxidation can be carried out using a thermal oxidation process. Thermal re-oxidation in accordance with preferred methods of the present invention can be carried out at a temperature of about 750° C. to about 1000° C. In another embodiment, re-oxidation can be carried out using plasma-assisted oxidation at a temperature below about 700° C. Referring to FIG. 2d, re-oxidation in accordance with the present invention can preferably be carried out until the thickness of the oxide layer 222 above one or more of the source/drain regions 210, 212 & 214 is thicker than the oxide layer above a channel region defined by the substrate space between two neighboring source/drain regions. Referring to FIG. 2c and FIG. 2d, in general, in accordance with the present invention, re-oxidation of the oxide layer can result in the rounding of the corners of the source/drain regions 210, 212 and 214, as well as the optional pocket implants 218a, 218b and 218c. In certain particularly preferred embodiments, the thickness of the oxide layer above one or more of the source/drain regions can exceed the thickness of the oxide layer above a channel region by about 40 angstroms, about 50 angstroms, or more.

In certain preferred embodiments of the present invention, the formation of the oxide layer, the re-oxidation of the oxide layer, or both can be carried out in a dry atmosphere. In certain more preferred embodiments of the methods according to the present invention, both the formation of the bottom oxide layer and re-oxidation of the bottom oxide layer are carried out in a dry atmosphere. As used herein, the term "dry atmosphere" refers generally to an oxidation, or re-oxidation, atmosphere having a water content of about 0.1% or less. In accordance with increasingly preferred embodiments of the present invention, a dry atmosphere in which the oxide layer can be formed and/or re-oxidized will have a water content of less than about 0.1%, less than about 0.01%, and most preferably less than about 0.001%.

The methods of the present invention further include forming a charge-trapping layer on the oxide layer. In certain preferred embodiments of the present invention, the charge-trapping layer comprises silicon nitride. Other suitable charge-trapping layers include, for example, tantalum oxide ($Ta_2O_5$), strontium titanate ($SrTIO_3$), barium strontium titanate ($BaSrTiO_2$), hafnium oxide ($HfO_2$), and the like. The charge trapping layer may also comprise a layer of silicon dioxide having two separated islands of polycrystalline silicon.

The methods of the present invention also further include forming an insulating layer on the charge-trapping layer. In certain preferred embodiments of the present invention, the insulating layer comprises silicon dioxide. Other exemplary materials suitable for use as the insulating material include non-conducting oxides and nitrides such as aluminum oxide and aluminum nitride.

Thus, for example, referring to FIG. 2e, a charge-trapping layer 224 can be formed on the oxide layer 222, and an insulating layer 226 can be formed on the charge-trapping layer 224. The oxide layer 222, the charge-trapping layer 224 and the insulating layer 226 collectively comprise the charge-trapping dielectric layer structure 220.

In certain embodiments of the present invention, the charge-trapping layer and/or the insulating layer can be formed using low-pressure chemical vapor deposition (LPCVD). In certain preferred embodiments of the present inventions, LPCVD oxide can be deposited at a temperature of below about 950° C. However, the charge-trapping layer and the insulating layer may be formed via any suitable process known in the art, including but not limited to, other chemical vapor deposition processes, plasma-assisted oxidation and nitridation, and thermal oxidation processes.

In certain embodiments of the present invention, the methods further include subjecting the insulating layer to an annealing process. Preferably, the anneal process is carried out in an atmosphere having a reduced hydrogen concentration. In increasingly more preferred embodiments, the insulating layer is annealed in an atmosphere having a hydrogen content of less than about 0.01%, less than about 1 ppm, and less than about 1 ppb. Most preferably, the insulating layer is annealed in a hydrogen-free atmosphere. As used herein, "a hydrogen-free atmosphere" refers to an atmosphere having an undetectable amount of hydrogen as measured by a mass spectrometer.

In certain preferred embodiments, the annealing of the insulating layer comprises a rapid thermal anneal, preferably carried out at a temperature of at least about 700° C., and more preferably carried out at a temperature of at least about 900° C. Generally, the annealing of the insulating layer is carried out a period of time of about 10 minutes or less. In even more preferred embodiments, the insulating layer is subjected to a rapid thermal anneal at a temperature of at least about 700° C., and more preferably at least about 900° C., in an atmosphere having a reduced hydrogen concentration, or more preferably, a hydrogen-free atmosphere. In certain preferred embodiments of the present invention, the formation of the oxide layer and/or the re-oxidation of the oxide layer are carried out in a dry atmosphere, and the insulating layer is subjected to an annealing process.

Figure 3:
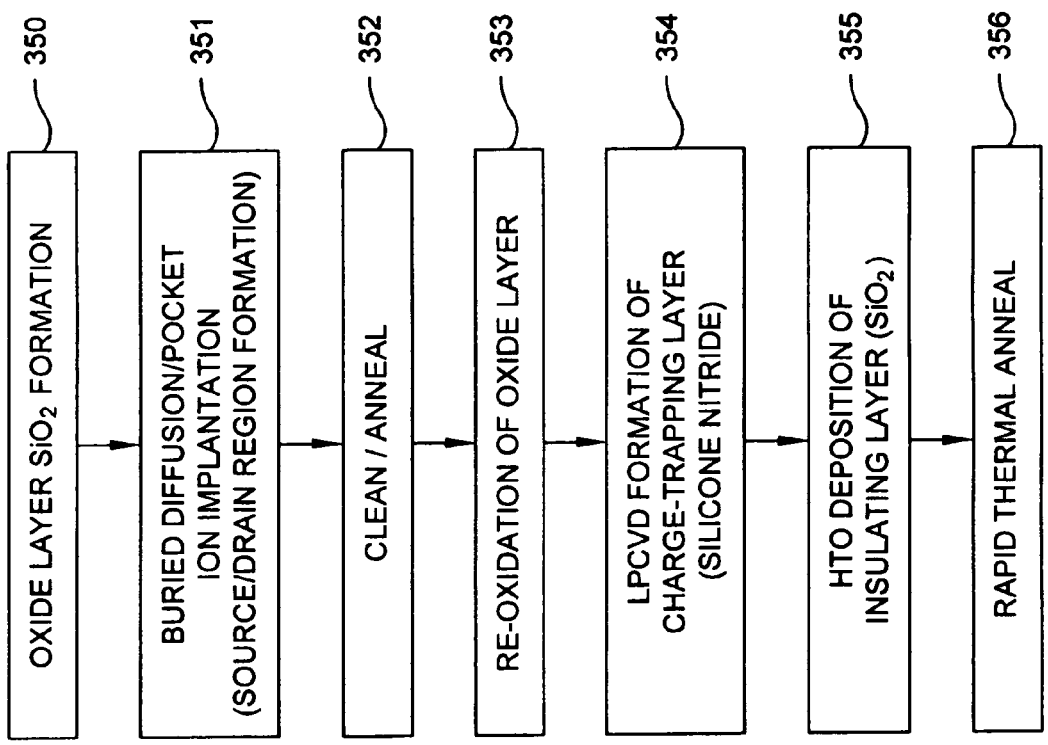
FIG. 3 is a flow chart of a method in accordance with one embodiment of the present invention.

Referring to FIG. 3, one preferred embodiment of the present invention includes a method comprising: formation of an oxide layer ($SiO_2$) on a substrate 350, preferably p-doped silicon, and preferably in a dry atmosphere; buried diffusion/pocket ion implantation, preferably n-type (source/drain region formation) 351; cleaning/annealing of the oxide layer 352; re-oxidation of the oxide layer 353, preferably in a dry atmosphere; LPCVD deposition of a charge-trapping layer (silicon nitride) 354; deposition of an insulating layer ($SiO_2$) 355; and annealing 356, preferably in an atmosphere having a reduced hydrogen concentration.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method comprising:
   providing a semiconductor substrate;
   forming an oxide layer on at least a portion of the substrate;
   before forming a charge-trapping layer, implanting ions through the oxide layer to form two or more source/drain regions in the substrate below the oxide layer;
   re-oxidizing the oxide layer;
   forming the charge-trapping layer on the oxide layer; and
   forming an insulating layer on the charge-trapping layer.

2. The method according to claim 1, further comprising cleaning and annealing the oxide layer prior to re-oxidation.

3. The method according to claim 1, wherein the oxide layer is formed in a dry atmosphere.

4. The method according to claim 1, wherein forming the two or more source/drain regions is carried out via ion implantation.

5. The method according to claim 1, wherein the re-oxidation is carried out in a dry atmosphere.

6. The method according to claim 1, wherein the formation of the charge-trapping layer is carried out using low pressure chemical vapor deposition.

7. The method according to claim 1, wherein the formation of the insulating layer is carried out using low pressure chemical vapor deposition.

8. The method according to claim 1, further comprising annealing the insulating layer.

9. The method according to claim 8, wherein the step of the annealing the insulating layer comprises a rapid thermal anneal.

10. The method according to claim 9, wherein the rapid thermal anneal is carried out at a temperature of at least about 700° C.

11. The method according to claim 8, wherein the step of the annealing the insulating layer is carried out in an atmosphere having a hydrogen content of less than about 0.01%.

12. The method according to claim 1, wherein the oxide layer is formed in a dry atmosphere, and wherein the re-oxidation is carried out in a dry atmosphere.

13. The method according to claim 1, wherein the oxide layer is formed in a dry atmosphere, wherein the re-oxidation is carried out in a dry atmosphere, and wherein the method further comprises annealing the insulating layer.

14. The method according to claim 1, wherein forming the oxide layer comprises thermally growing silicon dioxide, forming the charge-trapping layer comprises depositing silicon nitride, and forming the insulating layer comprises depositing silicon dioxide.

15. A method for forming an ONO layer on a silicon semiconductor substrate, said method comprising:
   providing a silicon semiconductor substrate;
   forming a bottom silicon dioxide layer on at least the portion of the substrate in a dry atmosphere;
   before depositing a silicon nitride layer, implanting ions through the bottom silicon dioxide layer to form two or more source/drain regions in the substrate below the bottom silicon dioxide layer;
   cleaning and annealing the bottom silicon dioxide layer;

re-oxidizing the bottom silicon dioxide layer in a dry atmosphere after the step of the cleaning and annealing the bottom silicon dioxide layer;

depositing the silicon nitride layer on the bottom silicon dioxide layer via low pressure chemical vapor deposition;

depositing a top silicon dioxide layer on the silicon nitride layer via low pressure chemical vapor deposition; and subjecting the top silicon dioxide layer to a rapid thermal anneal in an atmosphere having a hydrogen content of less than about 0.01%.

16. A method comprising:

providing a semiconductor substrate;

forming an oxide layer on at least a portion of the substrate in a dry atmosphere;

before forming a charge-trapping layer, implanting ions through the oxide layer to form two or more doped regions in the substrate below the oxide layer;

annealing the oxide layer;

re-oxidizing the oxide layer after the step of annealing the oxide layer;

forming the charge-trapping layer on the oxide layer;

forming an insulating layer on the charge-trapping layer; and annealing the insulating layer in an atmosphere having a hydrogen content of less than about 0.01%.

17. The method according to claim 16, wherein forming the oxide layer comprises thermally growing silicon dioxide, forming the charge-trapping layer comprises depositing silicon nitride, and forming the insulating layer comprises depositing silicon dioxide.

18. The method according to claim 16, wherein the step of the re-oxidizing the oxide layer is performed after formation of the two or more doped regions.

19. The method according to claim 18, further comprising cleaning the oxide layer prior to re-oxidation.

20. The method according to claim 18, wherein the re-oxidation is carried out in a dry atmosphere.

* * * * *